(12) United States Patent
Saito

(10) Patent No.: US 7,847,578 B2
(45) Date of Patent: Dec. 7, 2010

(54) POWER SUPPLY CIRCUIT AND TEST APPARATUS

(75) Inventor: Hisashi Saito, Tokyo (JP)

(73) Assignee: Advantest Corporation, Tokyo (JP)

( * ) Notice: Subject to any disclaimer, the term of this patent is extended or adjusted under 35 U.S.C. 154(b) by 307 days.

(21) Appl. No.: 12/058,753

(22) Filed: Mar. 30, 2008

(65) Prior Publication Data

US 2009/0243563 A1    Oct. 1, 2009

(51) Int. Cl.
*G01R 31/00* (2006.01)
(52) U.S. Cl. ..................................... 324/771
(58) Field of Classification Search .............. None
See application file for complete search history.

(56) References Cited

U.S. PATENT DOCUMENTS 4,598,255 A    7/1986    Hong
7,091,701 B2 *    8/2006    Turner et al. ............. 320/166

FOREIGN PATENT DOCUMENTS

JP    2006-155419    6/2006

OTHER PUBLICATIONS

Tietze, Schenk: Halbleiter-Schaltungstechnik, 8th Edition, Springer-Verlag 1986, p. 509, 510 and 527 (in German).
LM317 Data Sheet, Semiconductor Components industries LLC, Apr. 2004, Rev.7.
German Patent and Trademark Office action dated Jun. 28, 2010—File No. 10 2009 014 649.0-32 citing Non-Patent Literature Documents 1 and 2 above and citing US Patent No. 1 above.

* cited by examiner

*Primary Examiner*—Paresh Patel
(74) *Attorney, Agent, or Firm*—Jianq Chyun IP Office

(57)    ABSTRACT

Provided is a power supply circuit that supplies power to a load, including a power supply section that outputs a power supply current, a driver section that receives the power supply current from the power supply section and supplies the load with a load current that is consumed by the load, a capacitor section that is charged by the power supply section and that supplies the driver section with an auxiliary current when the load current is greater than the power supply current, and a transmission path that transmits the power supply current output by the power supply section to the driver section, wherein the capacitor section is disposed between the transmission path and a reference potential. The capacitor section is disposed between a transmission path and a reference potential. Also provided is a test apparatus including the power supply circuit.

4 Claims, 10 Drawing Sheets

POWER SUPPLY CIRCUIT AND TEST APPARATUS

BACKGROUND

1. Technical Field

The present invention relates to a power supply circuit and a test apparatus. In particular, the present invention relates to a power supply circuit that supplies power to a load, such as a semiconductor circuit, and a test apparatus that tests an electronic device, such as a semiconductor circuit.

2. Related Art

Conventionally, a power supply circuit is mounted on a test apparatus testing an electronic device to supply power to the electronic device. The power supply circuit has a driver section that generates a load voltage or a load current that is applied to the electronic device and also a power supply for driving the driver section as in, for example, Japanese Patent Application Publication No. 2006-155419.

The driver section uses the power from the power supply to generate the load current supplied to the electronic device. In other words, the test apparatus employs a power source that can generate the power supply current according to a maximum current of the load current supplied to the electronic device.

If the power supply corresponds to a temporary maximum current of the current supplied to the electronic device, however, the current capacitance of the power supply is undesirably increased. This increase leads to inefficiency because the current capacitance of the power supply becomes needlessly high.

SUMMARY

Therefore, it is an object of an aspect of the innovations herein to provide a power supply circuit and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary power supply circuit may include a power supply circuit that supplies power to a load, including a power supply section that outputs a power supply current, a driver section that receives the power supply current from the power supply section and supplies the load with a load current that is consumed by the load, and a capacitor section that is charged by the power supply section and that supplies the driver section with an auxiliary current when the load current is greater than the power supply current.

According to a second aspect related to the innovations herein, one exemplary test apparatus may include a test apparatus that tests a device under test, including a power supply circuit that supplies power for driving the device under test and a judging section that judges pass/fail of the device under test based on a state of the device under test during driving. In the test apparatus, the power supply circuit includes a power supply section that outputs a power supply current, a driver section that receives the power supply current from the power supply section and supplies a load with a load current that is consumed by the load, and a capacitor section that is charged by the power supply section and that supplies the driver section with an auxiliary current when the load current is greater than the power supply current.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
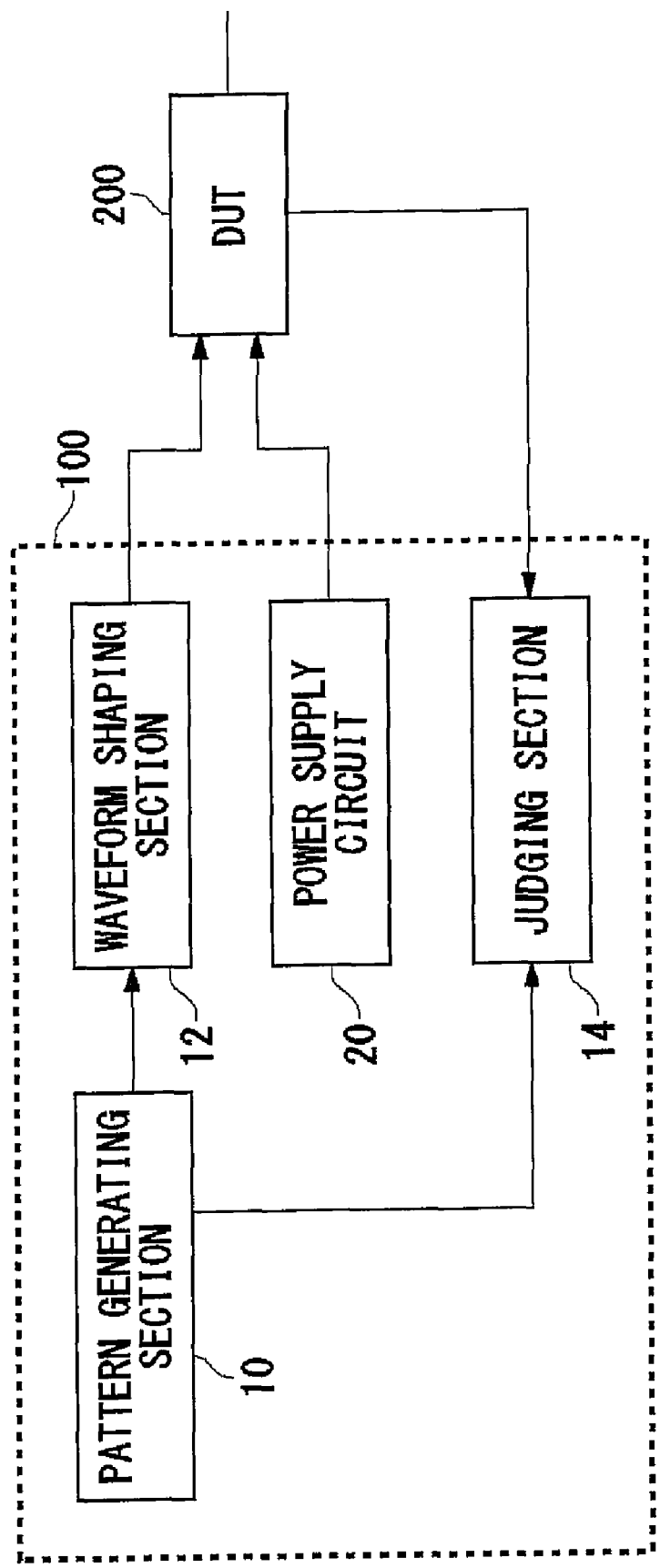
FIG. 1 shows an exemplary configuration of a test apparatus 100 according to an embodiment of the present invention.

FIG. 1 shows an exemplary configuration of a test apparatus 100 according to an embodiment of the present invention. The test apparatus 100 tests an electronic device 200 such as a semiconductor circuit and is provided with a pattern generating section 10, a waveform shaping section 12, a judging section 14, and a power supply circuit 20.

The pattern generating section 10 generates a test pattern that is supplied to the electronic device 200, based on a test program provided by a user or the like. For example, the pattern generating section 10 generates a pattern indicating, with an arrangement of data values of one and zero, a signal that is supplied to the electronic device 200, and a pattern indicating a timing at which the signal corresponding to these data values is supplied to the electronic device 200.

The waveform shaping section 12 generates the test signal supplied to the electronic device 200, based on the test pattern generated by the pattern generating section 10. The power supply circuit 20 supplies the supply power to drive the electronic device 200.

The judging section 14 judges pass/fail of the electronic device 200 based on the state of the electronic device 200 during driving. For example, the judging section 14 judges pass/fail of the electronic device 200 by comparing the output signal of the electronic device 200 to an expected value signal generated by the pattern generating section 10. The test apparatus 100 of the present embodiment judges pass/fail based on the output signal, but other exemplary test apparatuses may detect the load current supplied from the power supply circuit 20 to the electronic device 200 and judge pass/fail based on this load current.

Figure 2:
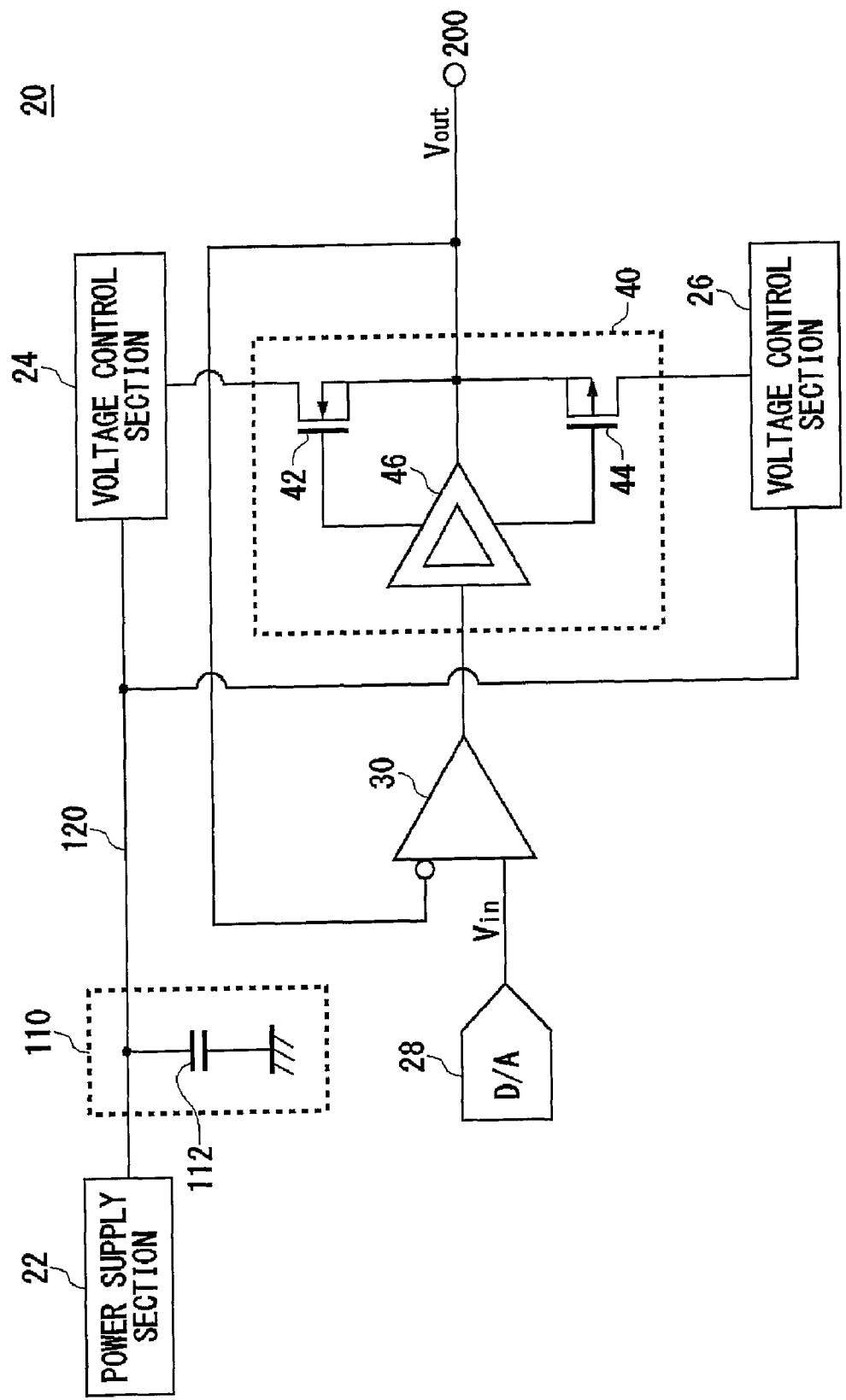
FIG. 2 shows an exemplary configuration of the power supply circuit 20.

FIG. 2 shows an exemplary configuration of the power supply circuit 20. The power supply circuit 20 has a digital-analog converter (referred to hereinafter as the "D/A 28") that functions as a voltage setting section, a power supply section 22, a capacitor section 110, a transmission path 120, a positive voltage control section 24, a negative voltage control section 26, a differential amplifier 30, and a driver section 40.

In the following description, the load voltage refers to the voltage supplied to the electronic device 200 and the load current refers to the current supplied to the electronic device 200. Furthermore, the power supply voltage refers to the voltage supplied from the power supply section 22 to the driver section 40 and the power supply current refers to the current supplied from the power supply section 22 to the driver section 40.

The D/A 28 is supplied with a digital value that indicates the voltage value to be applied to the electronic device 200. The D/A 28 generates an input voltage based on this digital value and supplies the input voltage to the driver section 40 via the differential amplifier 30. The driver section 40 supplies the load power to the electronic device 200 based on the input voltage.

The differential amplifier 30 controls the voltage supplied to the driver section 40 such that the load voltage $V_{out}$ supplied to the electronic device 200 is fed back, so that this load voltage becomes substantially equal to the input voltage that is output by the D/A 28. With such a configuration, the power supply circuit 20 can supply the electronic device 200 with a precise load voltage.

The power supply section 22 outputs the power supply current supplied to the driver section 40. The maximum value of the power supply current that can be output by the power supply section 22 may be less than the maximum value of the load current that can be supplied to the electronic device 200 by the power supply circuit 20.

The positive voltage control section 24 and the negative voltage control section 26 are electrically connected to the power supply section 22 via the transmission path 120. The positive voltage control section 24 and the negative voltage control section 26 receive the positive power supply voltage and the negative power supply voltage from the transmission path 120 and supply these voltages to the driver section 40. For example, the positive voltage control section 24 and the negative voltage control section 26 may control the power supply voltage applied to the driver section 40 to have a preset voltage value. The positive voltage control section 24 and the negative voltage control section 26 also receive the current to be supplied to the driver section 40, via the transmission path 120, and supply the current to the driver section 40.

The driver section 40 receives the power supply current from the power supply section 22 and supplies the electronic device 200 with a load current that is consumed by the electronic device 200. The driver section 40 of the present embodiment has an amplifier circuit 46, a source-side circuit 42, and a sink-side circuit 44. The amplifier circuit 46 generates a load voltage based on the supplied input voltage and applies the load voltage to the electronic device 200. The amplifier circuit 46 of the present embodiment generates the load voltage top be substantially equal to the supplied input voltage.

The source-side circuit 42 operates, according to the voltage output by the amplifier circuit 46 based on the input voltage, to supply the electronic device 200 with a source current. The positive voltage control section 24 may receive the voltage corresponding to the source current via the transmission path 120, and supply this voltage to the source-side circuit 42.

The source-side circuit 42 of the present embodiment is disposed between the positive voltage control section 24 and the electronic device 200, and has a P-type CMOS. The gate terminal of the P-type CMOS is supplied with the voltage output by the amplifier circuit 46 based on the input voltage. The CMOS is turned on when the input voltage is greater than or equal to a prescribed value. When turned on, the CMOS supplies the load voltage from the voltage control section 24 to the electronic device 200.

The sink-side circuit 44 operates, according to the voltage output by the amplifier circuit 46 based on the input voltage, to draw a sink current from the electronic device 200. The sink-side circuit 44 of the present embodiment is disposed between the negative voltage control section 26 and the electronic device 200, and has an N-type CMOS. The gate terminal of the N-type CMOS is supplied with the voltage output by the amplifier circuit 46 based on the input voltage. The CMOS is turned on when the input voltage is less than or equal to a prescribed value. When turned on, the CMOS draws the sink current from the electronic device 200 to the voltage control section 26.

When the capacitor section 110 is charged by the power supply section 22 and the load current, which can be either the source current or the sink current, is greater than the power supply current that the power supply section 22 can supply, the capacitor section 110 supplies the driver section 40 with an auxiliary current. The capacitor section 110 of the present embodiment includes a capacitor 112 that is disposed between the transmission path 120 and a reference potential, e.g. a ground potential. The capacitor 112 may be disposed on the transmission path 120 between the power supply section 22 and a point at which the transmission path 120 branches to the positive voltage control section 24 and the negative voltage control section 26.

By adopting such a configuration, the electronic device 200 can be supplied with the load current, even if the load current to be supplied to the electronic device 200 becomes momentarily greater than the power supply current outputtable by the power supply section 22. Since the power supply section 22 need not have the current capacitance corresponding to the load current momentarily consumed by the electronic device 200, a power supply section 22 having a smaller current capacitance can be used.

Figure 3:
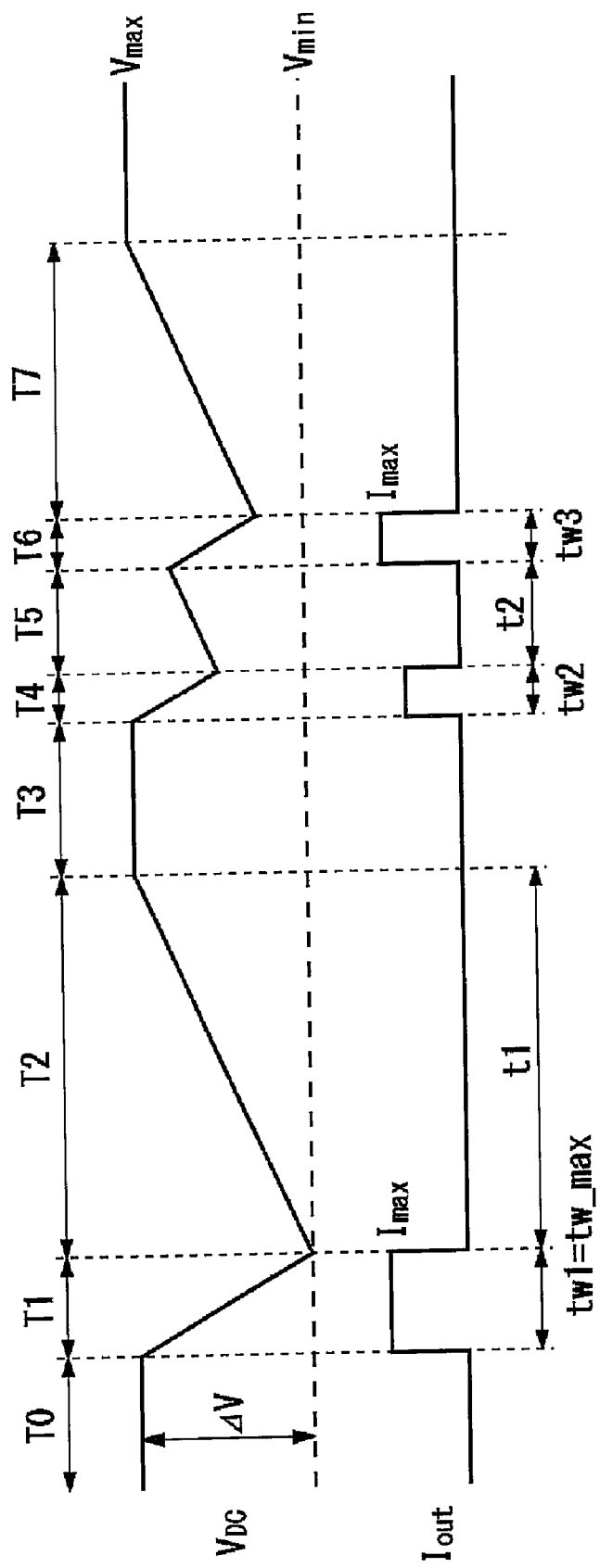
FIG. 3 is a timing chart showing an exemplary operation of the power supply circuit 20.

FIG. 3 is a timing chart showing an exemplary operation of the power supply circuit 20. In FIG. 3, $V_{DC}$ represents the voltage of the capacitor 112, $I_{out}$ represents the load current of the electronic device 200, $V_{max}$ represents the output voltage of the power supply section 22, $V_{min}$ represents the value set as the lower limit of $V_{DC}$, $I_{max}$ represents the maximum value of the load current.

Since the capacitor 112 does not output the auxiliary signal during a period T0, in which the load current $I_{out}$ is less than the power supply current outputtable by the power supply section 22, the voltage $V_{DC}$ of the capacitor 112 is equal to the voltage $V_{max}$ charged by the power supply section 22. During a period T1, in which the load current $I_{out}$ is greater than the power supply current outputtable by the power supply section 22, the auxiliary current output by the capacitor 112 is superimposed on the power supply current. By using the power supply section 22 to previously charge the capacitor 112 in this way, the driver section 40 can be supplied with a momentarily large current that the power supply section 22 cannot generate.

When the current is supplied from the capacitor 112 to the driver section 40, the voltage $V_{DC}$ of the capacitor 112 drops, which may also cause a drop in the voltage applied to the driver section 40. If this voltage drop occurs, the prescribed voltage might not be applied to the electronic device 200, which results in decreased testing accuracy. To avoid this problem, it is desirable to monitor whether the voltage $V_{DC}$ of the capacitor 112 falls below the prescribed lower limit value $V_{min}$.

Figure 4:
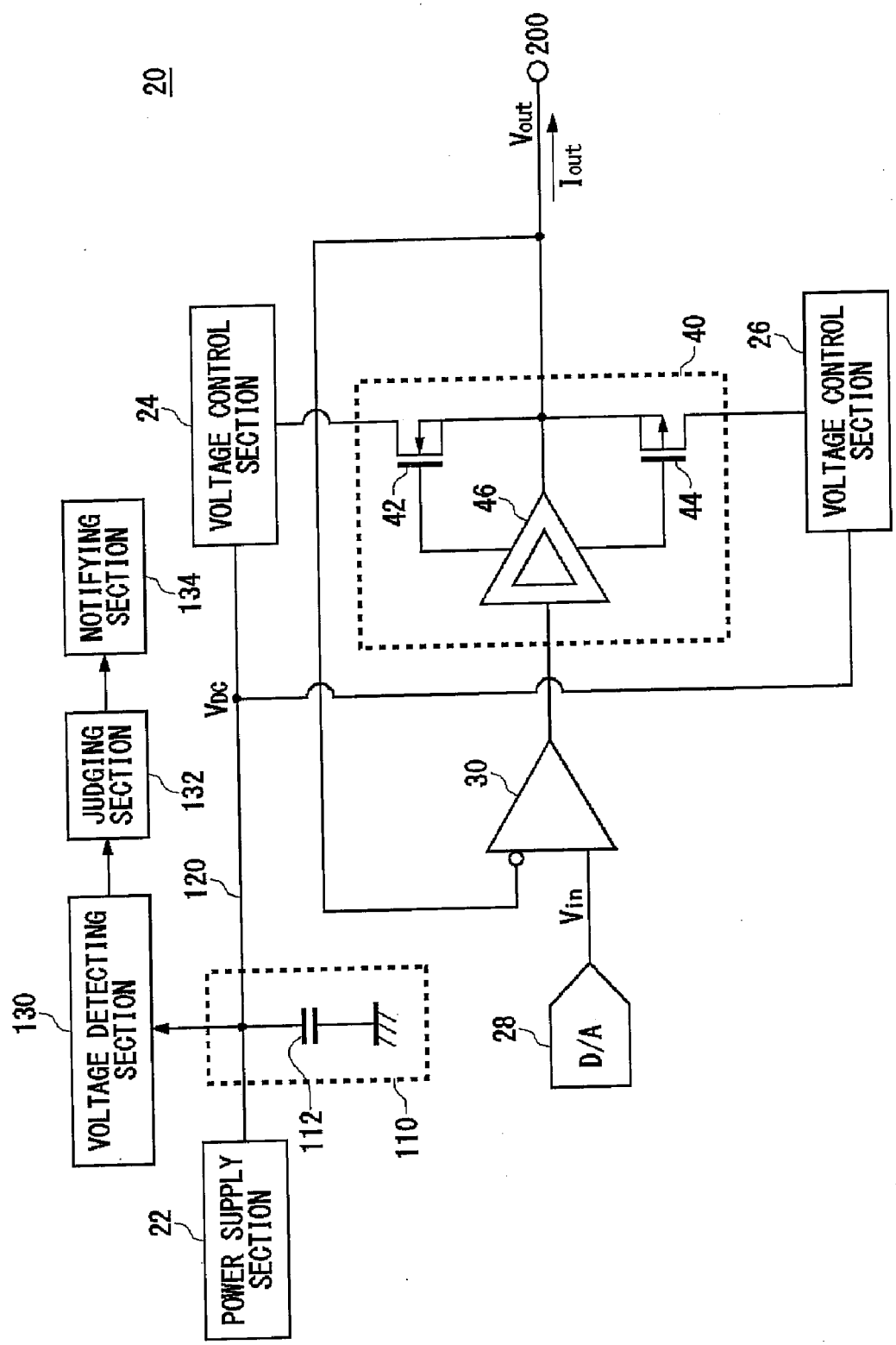
FIG. 4 shows another exemplary configuration of the power supply circuit 20.

FIG. 4 shows another exemplary configuration of the power supply circuit 20. The power supply circuit 20 of the present embodiment further includes a voltage detecting section 130, a judging section 132, and a notifying section 134 in addition to the configuration of the power supply circuit 20 described in relation to FIG. 2.

The voltage detecting section 130 detects a voltage at the connection point between the capacitor section 110 and the transmission path 120. In other words, the voltage detecting section 130 detects the voltage $V_{DC}$ of the capacitor 112.

The judging section 132 outputs an error detection signal when the voltage detecting section 130 detects a voltage that is less than the predetermined lower limit voltage $V_{min}$. The predetermined lower limit voltage $V_{min}$ may be set in the judging section 132 in advance according to the specifications of the electronic device 200.

The notifying section 134 notifies a user when the judging section 132 outputs the error detection signal. For example, when the notifying section 134 receives the error detection signal during testing of the electronic device 200, the notifying section 134 may notify the user that the error detection signal has been received when the testing of the electronic device 200 is finished. Performing the process described above results in more reliable test results concerning the electronic device 200.

When the notifying section 134 receives the error detection signal during testing of the electronic device 200, the notifying section 134 may notify the user and also end the testing by the test apparatus 100. As yet another example, when the notifying section 134 receives the error detection signal, the notifying section 134 may notify the user and continue testing by the test apparatus 100.

As shown in FIG. 3, the maximum time period tw_max during which the maximum value of the load current $I_{max}$ can be supplied is equal to the time period during which the voltage of the capacitor 112 decreases from the maximum value $V_{max}$ to the minimum value $V_{min}$. The slope indicating the voltage decrease of the capacitor 112 due to discharge is calculated from the current value $I_{max}$ and the capacitance value of the capacitor 112. More specifically, the time period tw_max can be calculated from a difference $\Delta V$ between the maximum value $V_{max}$ and the minimum value $V_{min}$ of the capacitor 112, the current value $I_{max}$, the capacitance value C of the capacitor 112, and the like.

The pattern generating section 10 described in relation to FIG. 1 may generate the test pattern such that the time period during which the maximum value of the load current $I_{max}$ flows to the electronic device 200 is less than or equal to the time period tw_max. The time period tw_max may be set in the pattern generating section 10 by the user or the like, or may be calculated by from the aforementioned $\Delta V$, current value $I_{max}$, and capacitance value C. The test apparatus may notify the user if a test pattern, generated by a test program provided by the user or the like, supplies the maximum value of the load current $I_{max}$ to the electronic device 200 over a time period longer than the time period tw_max.

When the load current $I_{out}$ less than the power supply current output by the power supply section 22, the capacitor 112 is charged to enable the large current to be supplied to the driver section 40. The time period t1, which is the time necessary for the voltage $V_{DC}$ of the capacitor 112 to return from the minimum value $V_{min}$ to the maximum value $V_{max}$, can also be calculated from the capacitance value of the capacitor 112 and the like, in the same manner as the time period tw_max.

When the pulse width of the load current $I_{out}$ is less than that of tw_max, as shown by T4-T6 in FIG. 3, the power supply circuit 20 may generate the pulse current to have an interval shorter than the time period t1. More specifically, the power supply circuit 20 can generate a pulse current having the prescribed current value, pulse width, and pulse interval, on a condition that the voltage $V_{DC}$ of the capacitor 112 not drop below the minimum value $V_{min}$. The pattern generating section 10 desirably generates a test pattern that fulfills this condition.

The test apparatus 100 may judge whether the test pattern generated by the pattern generating section 10 fulfills the condition. For example, the test apparatus 100 may judge whether the test pattern fulfills the condition by measuring the voltage $V_{DC}$ of the capacitor 112 during performance of the test pattern, or by running a simulation.

Figure 5:
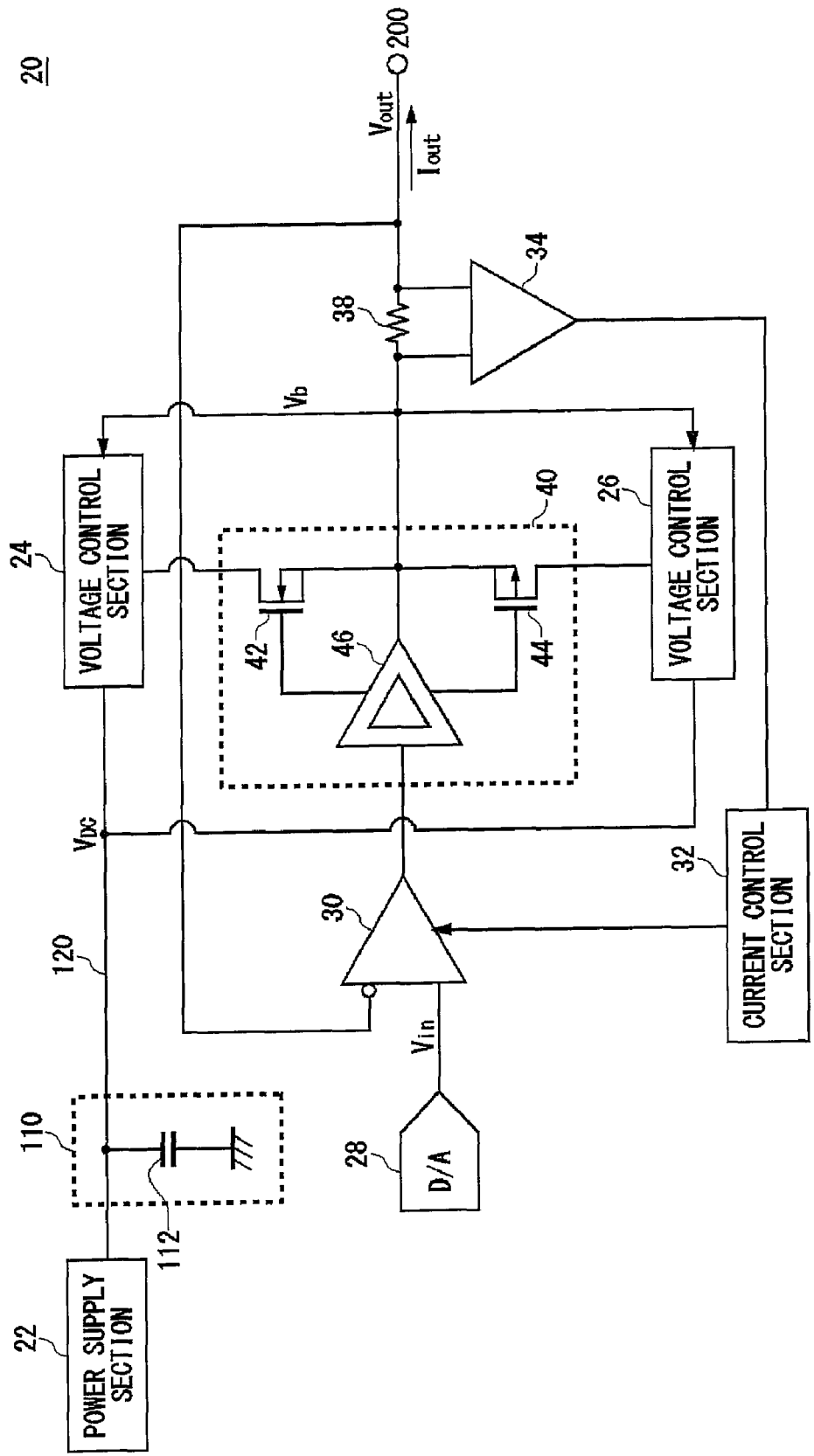
FIG. 5 shows another exemplary configuration of the power supply circuit 20.

FIG. 5 shows another exemplary configuration of the power supply circuit 20. The power supply circuit 20 of the present embodiment further includes a current control section 32, a current detecting section 34, and a current detection resistor 38 in addition to the configuration of any one of the power supply circuits 20 described in relation to FIGS. 1 to 4. The positive voltage control section 24 and the negative voltage control section 26 of the present embodiment control the positive power supply voltage and the negative power supply voltage that are applied to the driver section 40, based on the load voltage output by the driver section 40. FIG. 5 shows the current control section 32 and the like added to the configuration of the power supply circuit 20 shown in FIG. 2, but as another example, the current control section 32 and the like may be added to the configuration of the power supply circuit 20 shown in FIG. 4.

The current detection resistor 38 is disposed between the output terminal of the electronic device 200 and the driver section 40. The current detecting section 34 detects the potential difference between the ends of the current detection resistor 38 and supplies the current control section 32 with the detected value. The current control section 32 controls the voltage output by the differential amplifier 30 such that the potential difference detected by the current detecting section 34 does not become greater than or equal to a predetermined value. By adopting such a configuration, the power supply circuit 20 prevents excessive current from flowing to the electronic device 200.

The positive voltage control section 24 and the negative voltage control section 26 detect the voltage $V_b$ output by the driver section 40. The positive voltage control section 24 and the negative voltage control section 26 increase the power supply voltage applied to the driver section 40 when the voltage $V_b$ output by the driver section 40 increases, and decrease the power supply voltage applied to the driver section 40 when the voltage $V_b$ decreases.

The positive voltage control section 24 and the negative voltage control section 26 desirably control the power supply voltage such that the difference between the power supply voltage applied to the driver section 40 and the voltage $V_b$ output by the driver section 40 remains substantially constant. More specifically, the positive voltage control section 24 and the negative voltage control section 26 change the power supply voltage applied to the driver section 40 in accordance with the voltage $V_b$ output by the driver section 40. By controlling the power supply voltage in this way, the positive voltage control section 24 and the negative voltage control section 26 can reduce unnecessary power consumption by the driver section 40.

The positive voltage control section 24 is disposed between the power supply section 22 and the source-side circuit 42. The positive voltage control section 24 controls the positive power supply voltage applied to the source-side circuit 42 by the power supply section 22, based on the voltage output by the driver section 40. For example, the positive voltage control section 24 may control the positive power supply voltage such that the difference between the positive power supply voltage and the output voltage of the driver section 40 is a substantially constant value, as described above.

The negative voltage control section 26 is disposed between the power supply section 22 and the sink-side circuit 44. The negative voltage control section 26 controls the negative power supply voltage applied to the sink-side circuit 44 by the power supply section 22, based on the voltage output by the driver section 40. For example, the negative voltage control section 26 may control the negative power supply voltage such that the difference between the negative power supply voltage and the output voltage of the driver section 40 is a substantially constant value, as described above.

Figure 6:
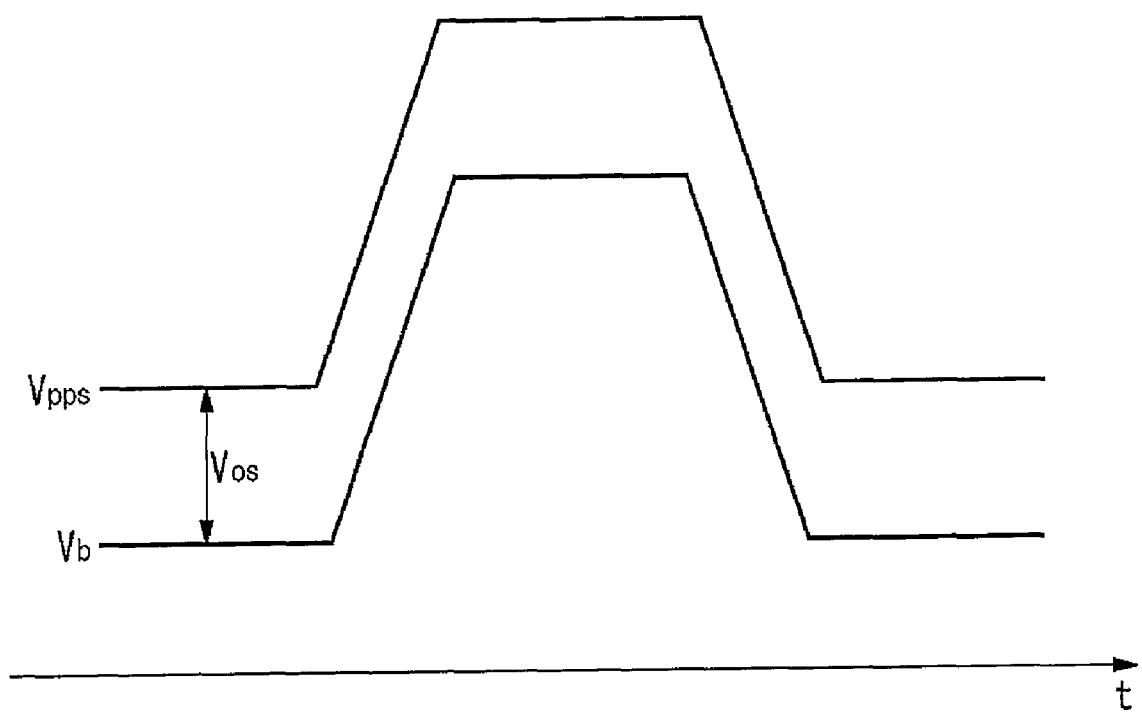
FIG. 6 shows an example of a waveform of the positive power supply voltage $V_{PPS}$ that the positive voltage control section 24 applies to the source-side circuit 42.

FIG. 6 shows an example of a waveform of the positive power supply voltage $V_{PPS}$ that the positive voltage control section 24 applies to the source-side circuit 42. The positive voltage control section 24 controls the positive power supply voltage $V_{PPS}$ such that the difference between the positive power supply voltage $V_{PPS}$ and the output voltage $V_b$ of the driver section 40 is a substantially constant voltage $V_{OS}$, as described above. The present embodiment describes only the positive voltage control section 24 controlling the positive power supply voltage $V_{PPS}$, but the voltage control section 26 controls the negative power supply voltage $V_{MPS}$ in the same manner. For example, the voltage control section 26 may control the negative power supply voltage $V_{MPS}$ to be a voltage equal to the prescribed voltage value $V_{OS}$ subtracted from the output voltage $V_b$ of the driver section 40.

By controlling the voltage in this way, the positive voltage control section 24 and the negative voltage control section 26 can prevent excessive application of voltage to the source-side circuit 42 and the sink-side circuit 44. Therefore, unnecessary power consumption by the source-side circuit 42 and the sink-side circuit 44 can be reduced. More specifically, the positive voltage control section 24 and the negative voltage control section 26 can reduce the current consumed by the driver section 40 by controlling the power supply voltage supplied to the driver section 40 based on the output voltage of the driver section 40.

Since the positive voltage control section 24 and the negative voltage control section 26 can reduce the unnecessary power consumption by the source-side circuit 42 and the sink-side circuit 44, the speed at which the voltage of the capacitor 112 drops when the auxiliary current is supplied from the capacitor 112 to the driver section 40 can also be reduced. By reducing the speed of the voltage drop, the maximum pulse width tw_max of the pulse current based on the auxiliary current can be increased. Since the driver section 40 does not consume excessive current, the charging speed of the capacitor 112 can be increased.

Figure 7:
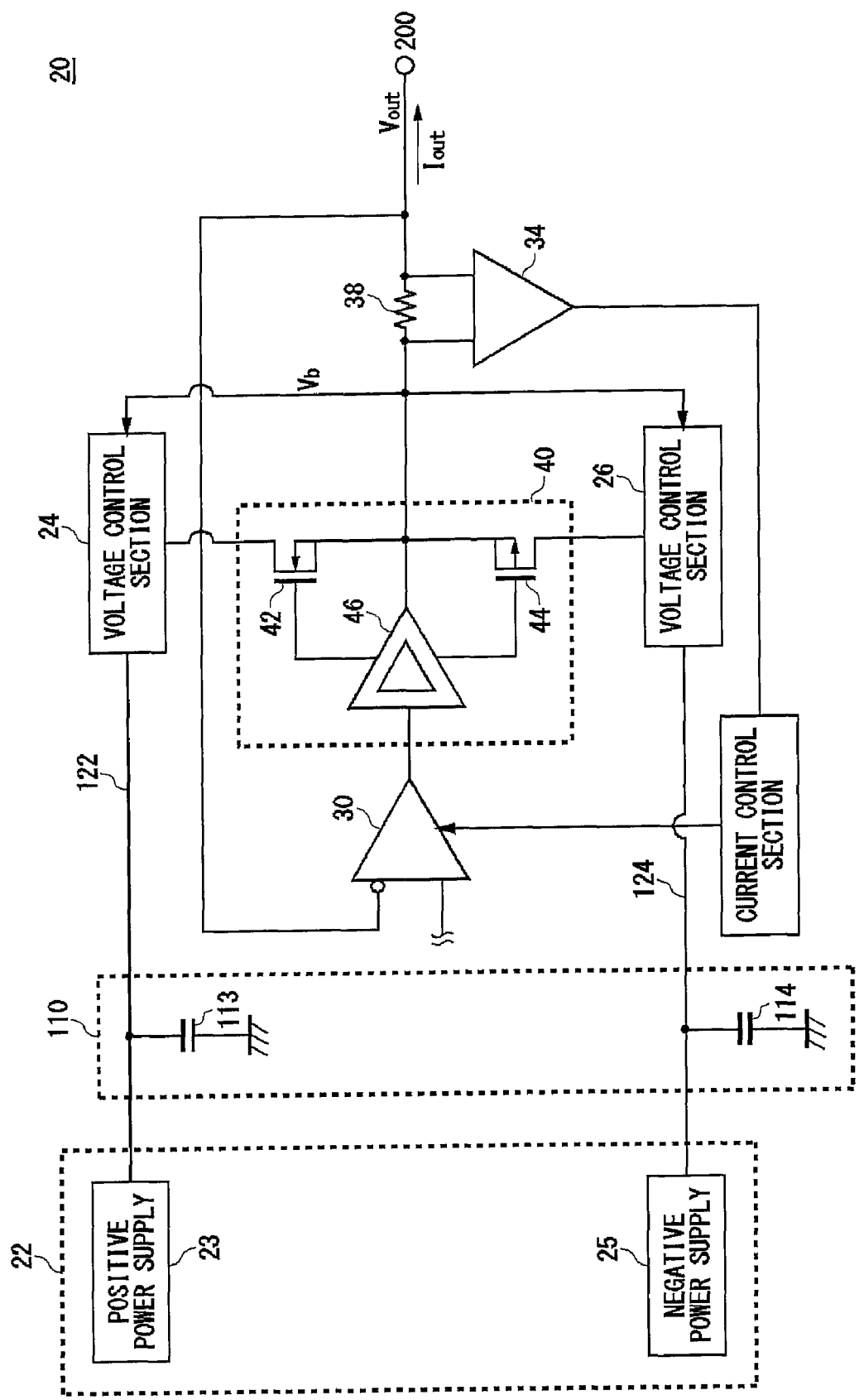
FIG. 7 shows another exemplary configuration of the power supply circuit 20.

FIG. 7 shows another exemplary configuration of the power supply circuit 20. The power supply circuit 20 of the present embodiment is different from any one of the configurations of the power supply circuits 20 described in relation to FIGS. 1 to 6 in regards to the power supply section 22, the transmission path 120, and the capacitor section 110. Other portions of the configuration of the power supply circuit 20 of the present embodiment may be identical to those of any one of the power supply circuits 20 described in relation to FIGS. 1 to 6. FIG. 7 shows a configuration based on the power supply circuit 20 shown in FIG. 5.

The power supply section 22 of the present embodiment has a positive power supply 23 and a negative power supply 25. The positive power supply 23 supplies the driver section 40 with the positive power supply voltage via a positive transmission path 122. The negative power supply 25 supplies the driver section 40 with the negative power supply voltage via a negative transmission path 124. The positive power supply 23 may supply the driver section 40 with a power supply voltage that is higher than the reference voltage. The negative power supply 25 may supply the driver section 40 with a power supply voltage that is lower than the reference voltage.

The capacitor section 110 of the present embodiment has a positive capacitor 113 and a negative capacitor 114. The positive capacitor 113 is charged and discharged between the positive power supply 23 and a positive power supply terminal, e.g. a terminal of the source-side circuit 42, of the driver section 40. More specifically, the positive capacitor 113 is disposed between the positive transmission path 122 and the reference potential.

The negative capacitor 114 is charged and discharged between the negative power supply 25 and a negative power supply terminal, e.g. a terminal of the sink-side circuit, of the driver section 40. More specifically, the negative capacitor 114 is disposed between the negative transmission path 124 and the reference potential. With such a configuration, the power supply circuit 20 can draw a large current from the electronic device 200.

Figure 8:
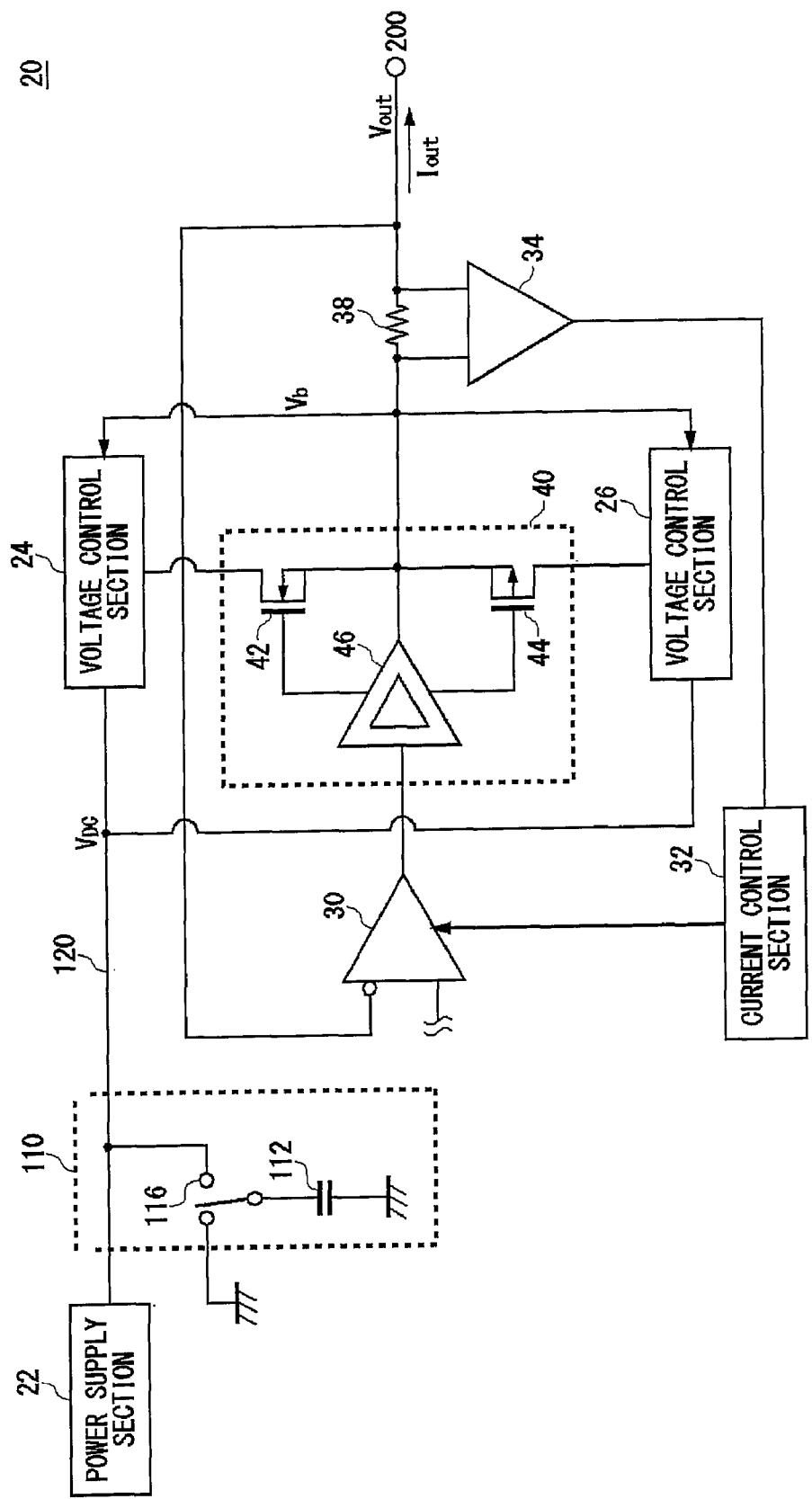
FIG. 8 shows another exemplary configuration of the power supply circuit 20.

FIG. 8 shows another exemplary configuration of the power supply circuit 20. The power supply circuit 20 of the present embodiment further includes a discharging section 116 in addition to the configuration of any one of the power supply circuits 20 described in relation to FIGS. 1 to 7. Other portions of the configuration of the power supply circuit 20 of the present embodiment may be the same as those of any one of the power supply circuits 20 described in relation to FIGS. 1 to 7. FIG. 8 shows a configuration based on the power supply circuit 20 shown in FIG. 5.

When the power supply of the power supply circuit 20 is turned off, the discharging section 116 discharges the capacitor 112 of the capacitor section 110. The discharging section 116 may have a switch that discharges the capacitor 112 by connecting both ends of the capacitor 112 to the reference potential. By adopting such a configuration, the flow of current from the condenser 112 can be stopped when the power supply circuit 20 is not operating, thereby protecting the power supply circuit 20.

Figure 9:
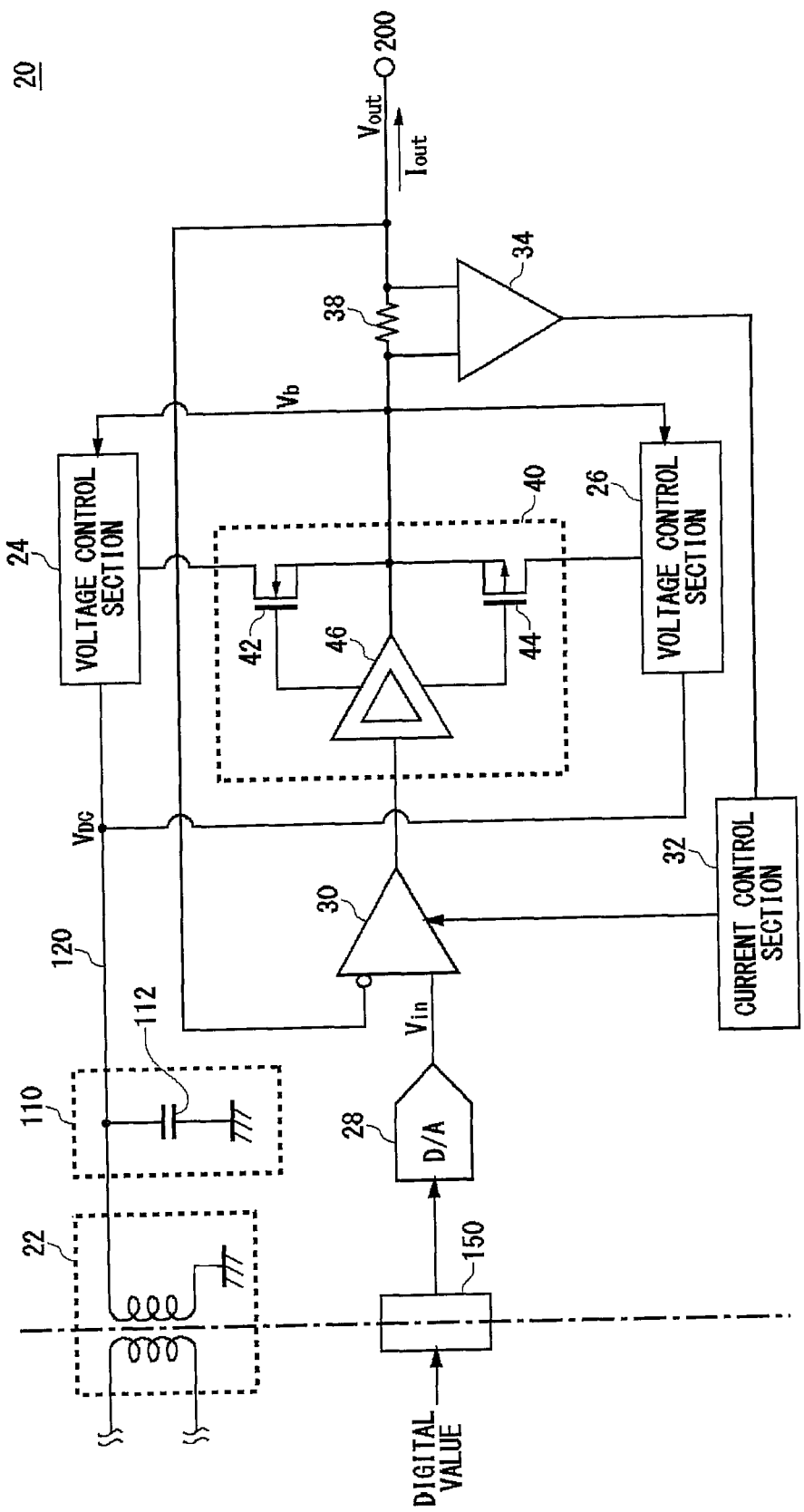
FIG. 9 shows another exemplary configuration of the power supply circuit 20.

FIG. 9 shows another exemplary configuration of the power supply circuit 20. The power supply circuit 20 of the present embodiment further includes an isolator 150 in addition to the configuration of any one of the power supply circuits 20 described in relation to FIGS. 1 to 8. Other portions of the configuration of the power supply circuit 20 of the present embodiment may be the same as those of any one of the power supply circuits 20 described in relation to FIGS. 1 to 8. FIG. 9 shows a configuration based on the power supply circuit 20 shown in FIG. 5.

The isolator 150 has an input side and an output side that are electrically insulated from each other. The isolator 150 receives a digital value at the input end and supplies the D/A 28 with the digital value from the output end. The isolator 150 may be a photocoupler or the like. The power supply section 22 of the present embodiment may be an insulated power supply in which the input side and the output side are insulated from each other by a transformer or the like. With such a configuration, the input side of the power supply circuit 20 can easily be isolated from the circuit section.

Figure 10:
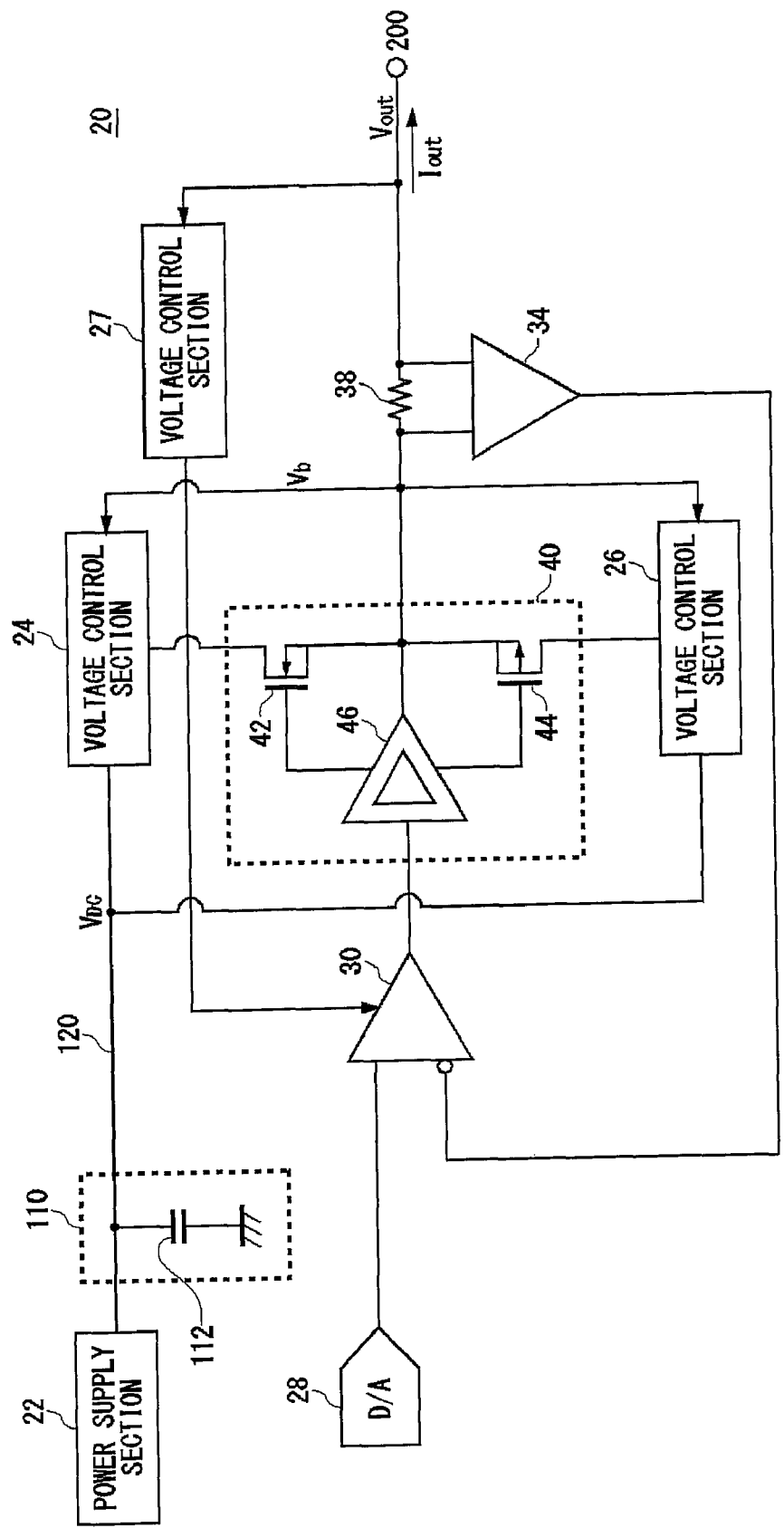
FIG. 10 shows another exemplary configuration of the power supply circuit 20.

FIG. 10 shows another exemplary configuration of the power supply circuit 20. The power supply circuit 20 of the present embodiment further includes a voltage control section 27, a current detecting section 34, and a current detection resistor 38 in addition to the configuration of either of the power supply circuits 20 described in relation to FIGS. 2 and 4. The configuration of the power supply circuit 20 of the present embodiment is different from that of the power supply circuits 20 described in relation to FIGS. 5, 7, 8, and 9 in that the power supply circuit 20 of the present embodiment has the voltage control section 27 instead of the current control section 32. FIG. 10 describes a configuration based on the power supply circuit 20 described in relation to FIG. 5.

The current detecting section 34 feeds the voltage difference between the ends of the current detection resistor 38 back to the negative input terminal of the differential amplifier 30. By doing this, the power supply circuit 20 can control the current flowing to the electronic device 200 to be a substantially constant value corresponding to the setting value of the D/A 28.

The voltage control section 27 detects the load voltage applied to the electronic device 200. When the load voltage exceeds a prescribed upper limit value, the voltage control section 27 controls the load voltage to be less than or equal to this upper limit value by decreasing the output current of the differential amplifier 30.

By adopting this configuration, the power supply circuit 20 can measure the on-resistance and the like of the electronic device 200. For example, the electronic device 200 may be a switch element. When the switch element is turned off, the load current does not flow to the electronic device 200, so that the output voltage of the driver section 40 is set by the voltage control section 27 to be the upper limit value.

Next, the switch element is turned on, so that the constant load current flows to the electronic device 200. At this time, the load voltage detected by the voltage control section 27 is determined by the on-resistance value of the switch element and the constant value of the load current. Since the load current is determined by the setting value of the D/A 28, the on-resistance value of the switch element can be calculated from the load voltage detected by the voltage control section 27.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

By using the power supply circuit 20 described above, the power supply section 22 having a relatively low current capacitance can be used to supply a large current to the load such as the electronic device 200. By using the power supply section 22 having a relatively low current capacitance, the cost of the power supply circuit 20 and the test apparatus 100 can be decreased.

What is claimed is:

1. A power supply circuit that supplies power to a load, comprising:
   a power supply section that outputs a power supply current;
   a driver section that receives the power supply current from the power supply section and supplies the load with a load current that is consumed by the load;
   a capacitor section that is charged by the power supply section and that supplies the driver section with an auxiliary current when the load current is greater than the power supply current;
   a voltage setting section that generates an input voltage based on a digital value supplied thereto, and that supplies the driver section with the input voltage; and
   an isolator that has an input side and an output side that are insulated from each other, and that supplies the digital value provided to the input side to the voltage setting section from the output side, wherein
   the power supply section has an input side and an output side that are insulated from each other, and outputs from the output side a voltage based on a voltage supplied to the input side.

2. The power supply circuit according to claim 1, further comprising a transmission path that transmits the power supply current output by the power supply section to the driver section, wherein the capacitor section is disposed between the transmission path and a reference potential.

3. The power supply circuit according to claim 2, further comprising a voltage control section that controls a power supply voltage supplied to the driver section, based on a voltage output by the driver section, to decrease a current consumed by the driver section.

4. The power supply circuit according to claim 3, wherein the voltage control section decreases the current consumed by the driver section by changing the power supply voltage supplied to the driver section in accordance with a change in the voltage output by the driver section.

* * * * *